US005502814A

United States Patent [19]

Yuuki et al.

[11] Patent Number: 5,502,814

[45] Date of Patent: Mar. 26, 1996

[54] METHOD OF DETECTING DEFECTIVE MEMORY LOCATIONS IN COMPUTER SYSTEM

[75] Inventors: Kazuhiro Yuuki; Satoru Sakai, both of Kawasaki, Japan

[73] Assignee: Fujitsu Limited, Kawasaki, Japan

[21] Appl. No.: 83,179

[22] Filed: Jun. 29, 1993

[30] Foreign Application Priority Data

Jun. 30, 1992 [JP] Japan .................................... 4-172107

[51] Int. Cl.[6] ............................ G06F 12/06; G06F 11/20

[52] U.S. Cl. ................................ 395/183.08; 395/183.18

[58] Field of Search .............................. 395/575, 183.18, 395/183.08, 185.01; 371/21.2, 21.6; 365/200, 201

[56] References Cited

U.S. PATENT DOCUMENTS 5,274,648 12/1993 Eikill et al. ............................ 371/21.2

FOREIGN PATENT DOCUMENTS 2202656 9/1988 United Kingdom .

OTHER PUBLICATIONS

CheckIt software collateral information, 1990. Published by TouchStone Software Corporation.

*Primary Examiner*—Robert W. Beausoliel, Jr.
*Assistant Examiner*—Alan M. Fisch
*Attorney, Agent, or Firm*—Staas & Halsey

[57] ABSTRACT

A method of detecting defective memory locations by determining a slot number corresponding to a memory address, when read data disagree with written data, determining a memory size corresponding to the determined slot number, determining relationships between data bit positions and memory module numbers according to the determined memory size, determining a memory module number as an abnormal memory according to the determined relationships, and specifying the slot number and the memory module number of the abnormal memory. Based on the specified slot number and memory module number, the defective memory module at the slot number can be quickly located and removed.

12 Claims, 10 Drawing Sheets

MEMORY CAPACITY : 8MB

RELATIONSHIP BETWEEN DATA BIT AND simm NUMBER

| DATA BIT | simm NUMBER |
|---|---|
| 0 TO 15 BITS | simm 0 |
| 16 TO 31 BITS | simm 1 |
| 32 TO 47 BITS | simm 2 |
| 48 TO 63 BITS | simm 3 |

MEMORY CAPACITY : 16MB

RELATIONSHIP BETWEEN DATA BIT AND simm NUMBER

| DATA BIT | simm NUMBER |
|---|---|
| 0 TO 7 BITS | simm 0 |
| 8 TO 15 BITS | simm 1 |
| 16 TO 23 BITS | simm 2 |
| 24 TO 31 BITS | simm 3 |
| 32 TO 39 BITS | simm 4 |
| 40 TO 47 BITS | simm 5 |
| 48 TO 55 BITS | simm 6 |
| 56 TO 63 BITS | simm 7 |

MEMORY CAPACITY : 32MB

RELATIONSHIP BETWEEN DATA BIT AND simm NUMBER

| DATA BIT | simm NUMBER |
|---|---|
| 0 TO 7 BITS | simm 0 |
| 8 TO 15 BITS | simm 1 |
| 16 TO 23 BITS | simm 2 |
| 24 TO 31 BITS | simm 3 |
| 32 TO 39 BITS | simm 4 |
| 40 TO 47 BITS | simm 5 |
| 48 TO 55 BITS | simm 6 |
| 56 TO 63 BITS | simm 7 |

Fig. 5A

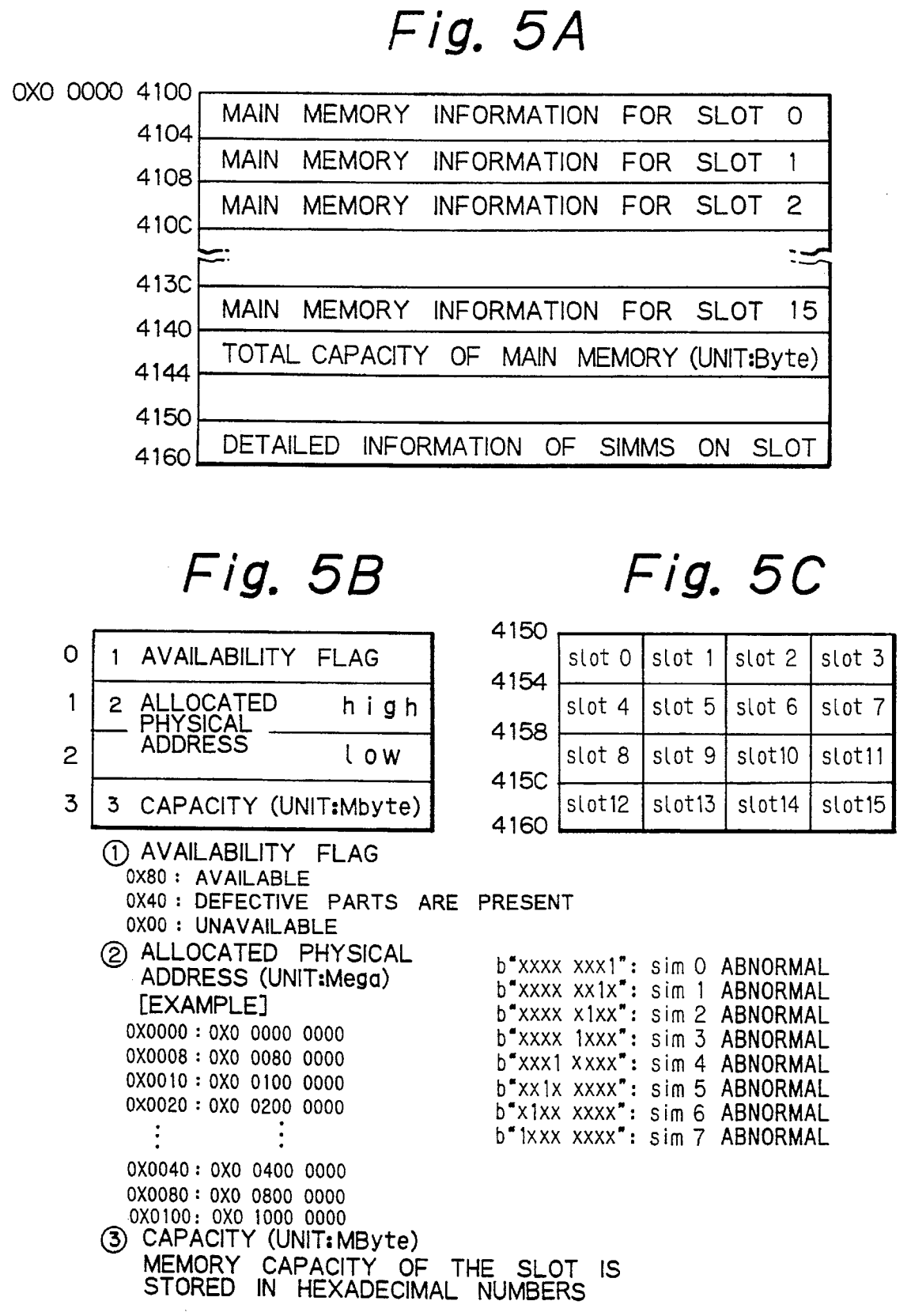

| Address | Contents |
|---|---|
| 0X0 0000 4100 | MAIN MEMORY INFORMATION FOR SLOT 0 |
| 4104 | MAIN MEMORY INFORMATION FOR SLOT 1 |
| 4108 | MAIN MEMORY INFORMATION FOR SLOT 2 |
| 410C | ⋮ |
| 413C | MAIN MEMORY INFORMATION FOR SLOT 15 |
| 4140 | TOTAL CAPACITY OF MAIN MEMORY (UNIT:Byte) |
| 4144 | |
| 4150 | DETAILED INFORMATION OF SIMMS ON SLOT |
| 4160 | |

Fig. 5B

| | | |
|---|---|---|
| 0 | 1 AVAILABILITY FLAG | |
| 1 | 2 ALLOCATED PHYSICAL ADDRESS | high |
| 2 | | low |
| 3 | 3 CAPACITY (UNIT:Mbyte) | |

① AVAILABILITY FLAG
- 0X80 : AVAILABLE
- 0X40 : DEFECTIVE PARTS ARE PRESENT
- 0X00 : UNAVAILABLE

② ALLOCATED PHYSICAL ADDRESS (UNIT:Mega)
[EXAMPLE]
- 0X0000 : 0X0 0000 0000
- 0X0008 : 0X0 0080 0000
- 0X0010 : 0X0 0100 0000
- 0X0020 : 0X0 0200 0000
- ⋮ ⋮
- 0X0040 : 0X0 0400 0000
- 0X0080 : 0X0 0800 0000
- 0X0100 : 0X0 1000 0000

③ CAPACITY (UNIT:MByte)
MEMORY CAPACITY OF THE SLOT IS STORED IN HEXADECIMAL NUMBERS

Fig. 5C

| Address | | | | |
|---|---|---|---|---|
| 4150 | slot 0 | slot 1 | slot 2 | slot 3 |
| 4154 | slot 4 | slot 5 | slot 6 | slot 7 |
| 4158 | slot 8 | slot 9 | slot10 | slot11 |
| 415C | slot12 | slot13 | slot14 | slot15 |
| 4160 | | | | |

- b"xxxx xxx1": sim 0 ABNORMAL
- b"xxxx xx1x": sim 1 ABNORMAL
- b"xxxx x1xx": sim 2 ABNORMAL
- b"xxxx 1xxx": sim 3 ABNORMAL
- b"xxx1 xxxx": sim 4 ABNORMAL
- b"xx1x xxxx": sim 5 ABNORMAL
- b"x1xx xxxx": sim 6 ABNORMAL
- b"1xxx xxxx": sim 7 ABNORMAL

```
R O M : E R R O R : R O 0 4 4
 ①
X X ; X X ; X X ; X X ; X X
 ②    ③     ④     ⑤     ⑥
```

XX ······ AN 8-BIT HEXADECIMAL NUMBER REPRESENTING A SIMM POSITION b"XXXXXXXX"
- SIMM 0 HEX. No.1
- SIMM 1 HEX. No.2
- SIMM 2 HEX. No.4
- SIMM 3 HEX. No.8
- SIMM 4 HEX. No.10
- SIMM 5 HEX. No.20
- SIMM 6 HEX. No.40
- SIMM 7 HEX. No.80

ROM:ERROR:R0044
01;80;30;**;___

- SIMM 1 IN SLOT 0 IS ABNORMAL.
- SIMM 80 IN SLOT 1 IS ABNORMAL.
- SIMMS 10 AND 20 IN SLOT 2 ARE ABNORMAL.
- PERIPHERAL CIRCUIT OF SLOT 3 IS ABNORMAL.
- SLOT 4 HAS NO SIMM.

METHOD OF DETECTING DEFECTIVE MEMORY LOCATIONS IN COMPUTER SYSTEM

BACKGROUND OF THE INVENTION

1. Field of the Invention

The present invention relates to a method of detecting defective memory locations in a computer system.

2. Description of the Related Art

Today, main memories of computer systems are required to be flexibly extendable. To achieve the flexibility, standardized SIMMs (Single In-line Memory Modules) are employed in the main memories. An advantage of the standardized SIMMs is that they are employable for different systems. When a memory abnormality occurs, SIMMs attached to (plugged into) a slot are replaced. In this case, it is required to specify (detect) not only the slot number but also the number of the defective (abnormal) SIMM. A conventional computer system provided with a memory board having SIMMs determines the memory slot number when a memory abnormality occurs, and all of the SIMMs in the slot are entirely replaced.

SUMMARY OF THE INVENTION

An object of the present invention is to provide a method of specifying abnormal (detecting defective) memory locations in a computer system memory board containing a plurality of standardized SIMMs (minimum replaceable memory units) and to specify the slot numbers and SIMM numbers on which failures (abnormalities) have been found, thereby realizing easy maintenance and quick restoration of system functions.

According to the present invention, there is provided a method of detecting defective memory locations comprising the steps of writing data to a memory address for diagnosing a main memory, reading the written data from the memory address of the main memory, comparing the read data with the written data for determining whether or not they agree with each other, finding a slot number corresponding to the memory address, when the read data disagree with the written data, finding a memory size corresponding to the found slot number, finding relationships between data bit positions and standardized SIMM numbers according to the found memory size and finding SIMM numbers corresponding to the disagreeing data bits as abnormal memories according to the found relationships therebetween, and specifying slot numbers and SIMM numbers that involve memory abnormalities.

The slot number finding step may refer slot address registers to find the slot number related to the memory abnormality. The memory size finding step may refer slot capacity registers to find the memory size. The relationship and SIMM number finding step may refer a SIMM table to find relationships between the data bit positions and the standardized SIMM numbers.

The specified slot numbers and SIMM numbers of the abnormal memories may be displayed on an LCD or a display device.

According to the present invention, there is also provided a computer system having a CPU, a system bus, a memory controller connected to the CPU through the system bus, a memory connected to the memory controller, the memory including a plurality of slots, and each of the slots including a plurality of SIMMs, wherein the computer system comprises a unit for writing data to a memory address for diagnosing a main memory, a unit for reading the written data from the memory address of the main memory, a unit for comparing the read data with the written data for determining whether or not they agree with each other, a unit for finding a slot number corresponding to the memory address, when the read data disagree with the written data, a unit for finding a memory size corresponding to the found slot number, a unit for finding relationships between data bit positions and standardized SIMM numbers according to the found memory size, and for finding SIMM numbers corresponding to the disagreeing data bits as abnormal memories according to the found relationships therebetween, and a unit for specifying slot numbers and SIMM numbers that involve memory abnormalities.

BRIEF DESCRIPTION OF THE DRAWINGS

The present invention will be more clearly understood from the description of the preferred embodiments as set forth below with reference to the accompanying drawings, wherein:

FIG. 4 is a diagram showing an example of a SIMM table according to the present invention;

FIGS. 5A, 5B, and 5C are diagrams for explaining an operation of the method of detecting defective memory locations according to the present invention;

DETAILED DESCRIPTION OF THE PREFERRED EMBODIMENTS

For a better understanding of the preferred embodiments, the problems of the prior art will be explained, with reference to FIG. 1.

Figure 1:
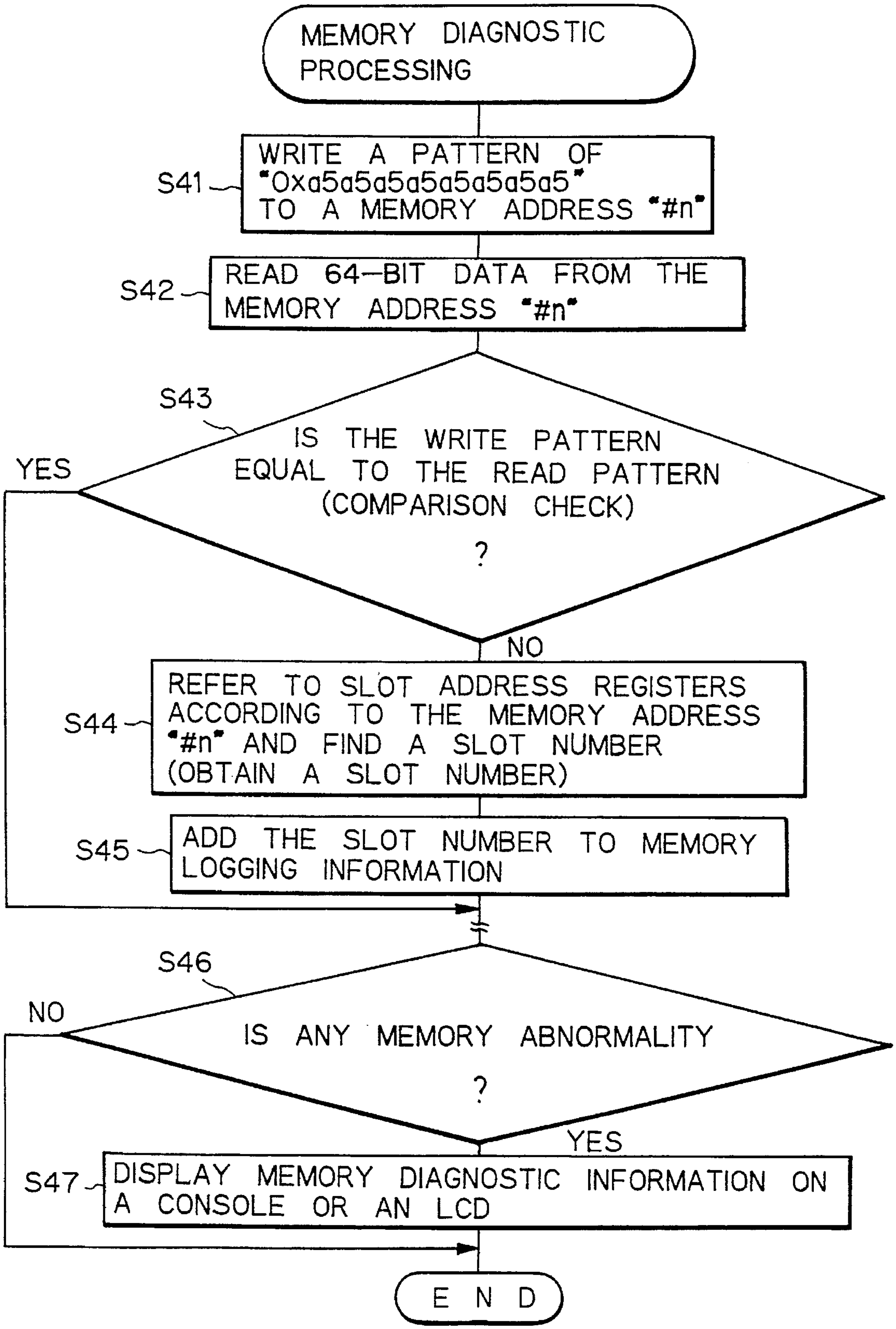
FIG. 1 is a flowchart for explaining an example of a memory diagnostic processing of a computer system according to the prior art.

FIG. 1 shows an example of a memory diagnostic processing of a computer system according to the prior art.

A conventional computer system provided with a memory board having SIMMs (Single In-line Memory Modules) finds a memory slot number when a memory abnormality occurs, as shown in FIG. 1. SIMMs corresponding to the abnormal (defective) slot are entirely replaced.

As shown in FIG. 1, in Step S41, a pattern of 0xa5a5a5a5a5a5a5a5 is written to a memory address #n, to diagnose a main memory. Note, in the pattern "0xa5a5a5a5a5a5a5a5", "0x" defines the following numbers to be hexadecimal numbers. Further, "a" of the hexadecimal number is indicated by "1010" in a binary number, and "5" of the hexadecimal number is indicated by "0101" in the binary number. Namely, the pattern "0xa5a5a5a5a5a5a5a5" indicates "1010 0101 1010 0101 . . . 1010 0101" of 64-bits in the binary number.

Next, in Step S42, data of the memory address #n is read by 64-bits. Further, in Step S43, a comparison test is carried out. Namely, in Step S43, the data written in Step S41 is compared with the dada read in Step S42, and it is determined whether or not they agree with each other. If they are agree with each other, the memory is normal, and Step S46 is carried out. If they do not agree with each other, the memory is abnormal, and Step S44 is carried out.

In Step S44, slot address registers according to the memory address #n are referred, to find a slot number. Namely, according to the memory address #n where the written and read data disagree with each other, the slot address registers are accessed to obtain a slot number that is causing the memory abnormality. Further, in Step S45, the slot number is added to memory logging information. The same test is repeated for other memory addresses.

In Step S46, it is determined whether or not there is a memory abnormality. Namely, Step S41 to S45 are carried out for all (or representative) memory addresses, and further, in Step S46, it is determined whether or not the memory logging information contains slot numbers involving memory abnormalities. If there are any abnormal slot numbers, in Step, S47, the memory diagnostic information is displayed on a CRT or another display device) included in a console or an LCD (Liquid Crystal Display). Note, the memory diagnostic information may be displayed on the LCD, when the console having a display device is not provided.

For example, a message of "Slot No. X is causing memory abnormalities" is displayed as the memory diagnostic information. Then, the process ends. If there is no abnormal slot number, the process ends with no memory abnormality. As explained above, the prior art diagnoses a memory board slot by slot even if the memory board involves a plurality of standardized SIMMs.

Since the prior art diagnoses a memory board slot by slot even if the memory board involves a plurality of standardized SIMMs, all SIMMs including normal SIMMs of a slot must be replaced if an abnormality is found on the slot.

Below, the preferred embodiments of a method of detecting defective memory locations in a computer system according to the present invention will be explained, with reference to the accompanying drawings.

Figure 2A:
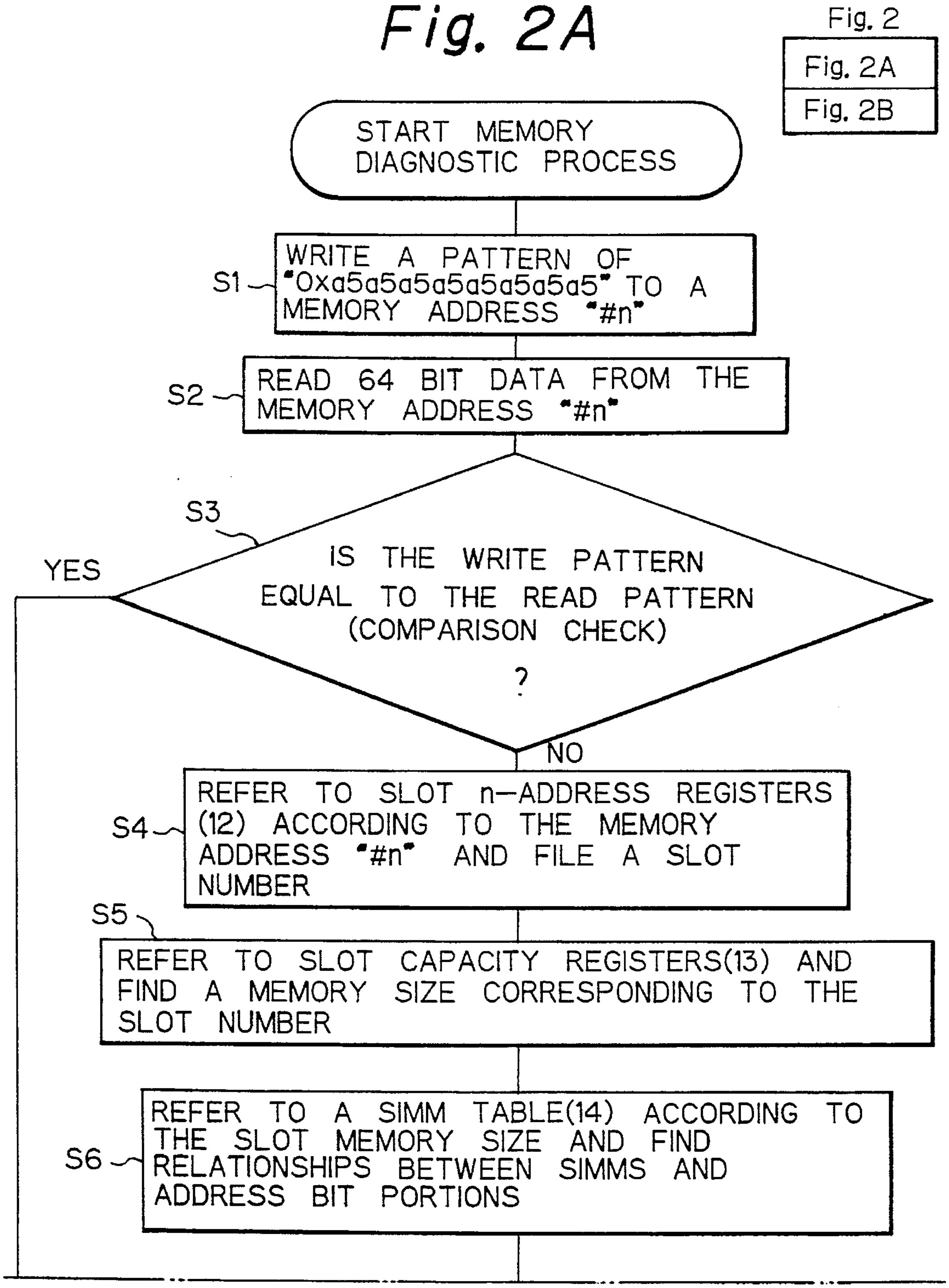
FIG. 2, consisting of FIGS. 2A and 2B, is a flowchart for explaining an example of a memory diagnostic processing of a computer system according to the present invention.
Figure 2B:
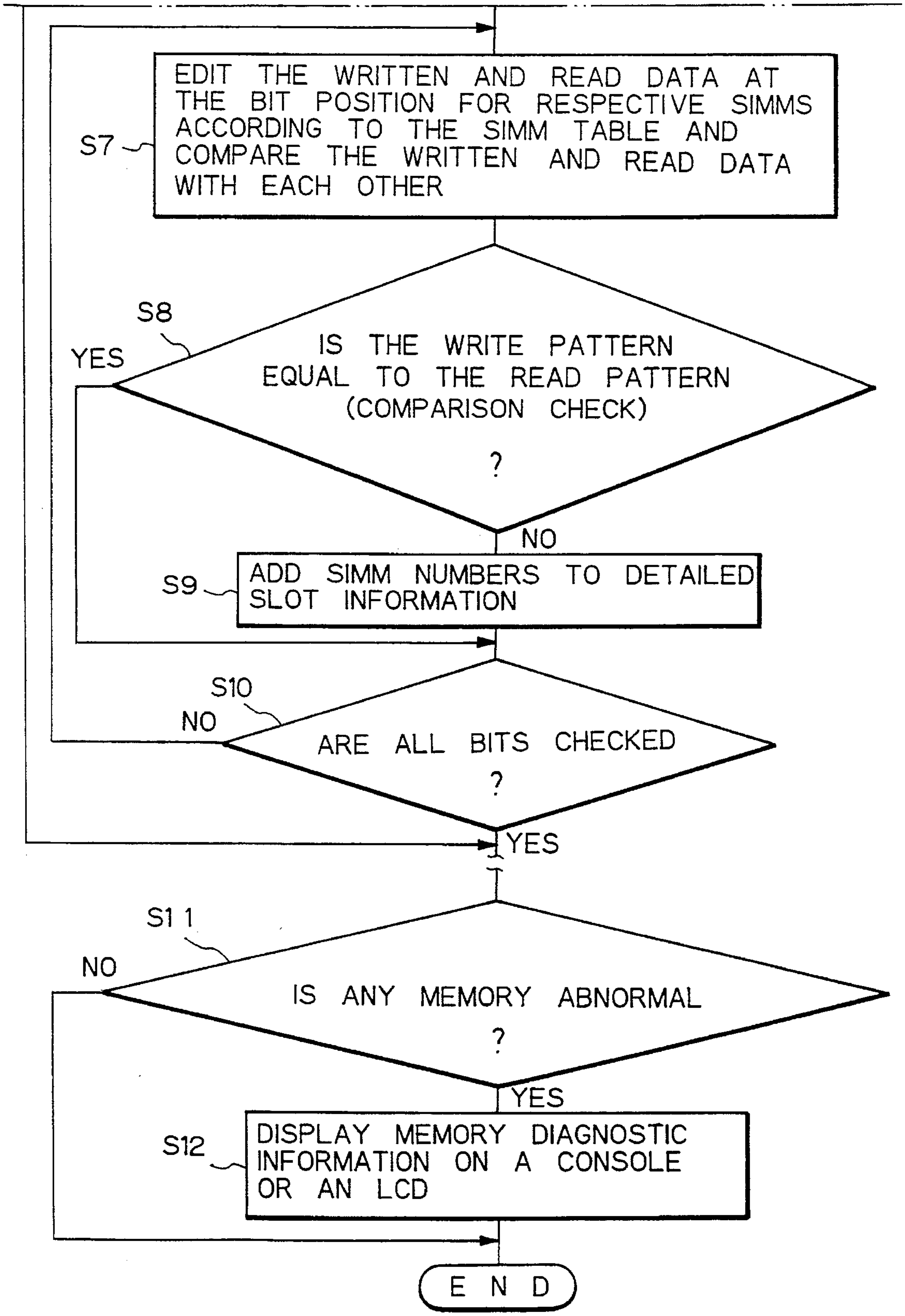

FIG. 2, which consists of FIGS. 2A and 2B, shows an example of a memory diagnostic processing of a computer system according to the present invention.

As shown in FIGS. 2A and 2B, slot address registers 12 are used to find a slot number n (Step S4), slot capacity registers 13 are used to find a memory capacity corresponding to the slot number n (Step S5), and a SIMM table 14 is used to find relationships between data bit positions and SIMM numbers for each memory capacity (Step S6).

Namely, the present invention writes data to a memory address n, reads the data, compares the written and read data with each other, accesses the slot address registers 12 according to the memory address n, to find a slot number when the data do not agree with each other, refers to the slot capacity registers 13 according to the slot number, to find a memory size corresponding to the slot number, looks up the SIMM table 14 according to the memory size, to find relationships between data bit positions and standardized SIMM numbers, and calculates SIMM numbers corresponding to the disagreeing bits according to the relationships, to thereby specify (detect) slot numbers and SIMM numbers where memory abnormalities are occurring.

In this way, the present invention diagnoses a memory board having a plurality of standardized SIMMs (minimum replaceable units) and specifies slot numbers and SIMM numbers where memory abnormalities are occurring, to thereby enable smooth maintenance and quick repair of defective parts.

As shown in FIG. 2 (FIGS. 2A and 2B), in Step S1, a pattern of 0xa5a5a5a5a5a5a5a5 is written to a memory address #n, to diagnose a main memory. Note, in the pattern "0xa5a5a5a5a5a5a5a5", "0x" defines the following numbers to be hexadecimal numbers. Further, "a" of the hexadecimal number is indicated by "1010" in a binary number, and "5" of the hexadecimal number is indicated by "0101" in the binary number. Namely, the pattern "0xa5a5a5a5a5a5a5a5" indicating "1010 0101 1010 0101 . . . 010 0101" of 64-bits in the binary number is written to the memory address #n in a memory board 15 shown in FIG. 8.

Next, in Step S2, data of the memory address #n is read by 64-bits. Namely, in Step S2, data having a width of 64 bits is read from the same memory address #n to which S1 has written the data. Further, in Step S3, a comparison test is carries out. Namely, in Step S3, the data written in Step S1 is compared with the dada read in Step S2, and it is determined whether or not they agree with each other. If they agree with each other, the memory is normal, and Step S11 is carried out. If they do not agree with each other, the memory is abnormal (defective), and Steps S4 through S10 are carried out.

In Step S4, slot address registers 12 are referred according to the memory address #n, to find a slot number. Namely, the slot address registers 12 shown in FIG. 3C are examined according to the memory address #n at which the written data and read data disagree with each other, to find a slot number. Next, in Step S5, slot capacity registers 13 are referred to, to find a memory size corresponding to the slot number. Namely, the slot capacity registers 13 of FIG. 3B are examined to find a memory size (capacity) for the slot number. Further, in Step S6, SIMM table 14 is referred to, to find relationships between SIMM numbers and address bit positions according to the memory size obtained. Namely, the SIMM table 14 of FIG. 4 is looked up to find relationships between SIMM numbers and address bit positions, according to the memory size obtained in Step S5.

Next, in Step S7, the written and read data are edited at the bit positions for respective SIMMs according to the SIMM table, and the written and read data are compared with each other. For example, the SIMM table 14 of FIG. 4 tells that data bits 0 to 15 correspond to SIMM 0 when the memory capacity of a corresponding slot is 8 megabytes (MB). Accordingly, for the SIMM 0, the bits 0 to 15 of each of the written and read data are picked up.

Further, in Step S8, the written and read data edited in Step S7 are compared with each other, and it is determined whether or not they agree with each other. If they agree with each other, it is determined that the written and read data for a corresponding SIMM agree with each other and that there is no memory abnormality. Then, Step S10 is carried out. If they do not agree with each other, it is determined that the written and read data for a corresponding SIMM disagree with each other and that there is a memory abnormality. Then, Step S9 adds the SIMM number to detailed slot information. After the SIMM number corresponding to the memory abnormality is stored, Step S10 is carried out.

Figure 6:
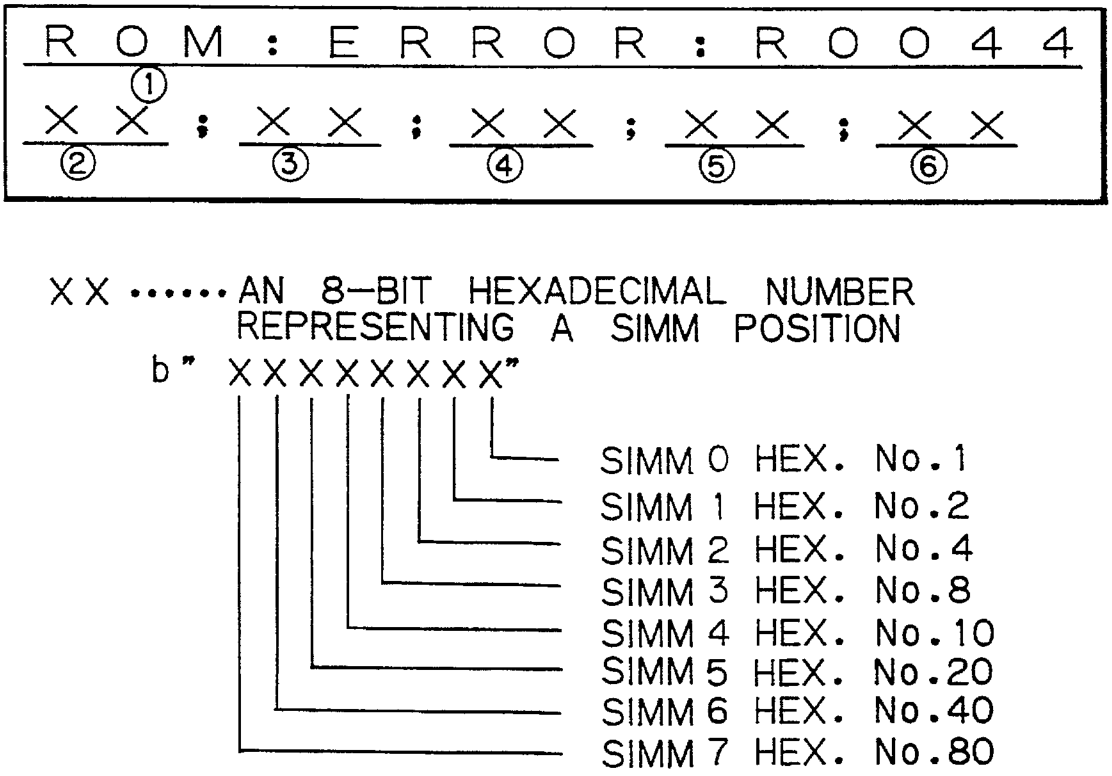
FIG. 6 is a diagram showing an example of diagnosed abnormalities displayed on an LCD.
Figure 7:
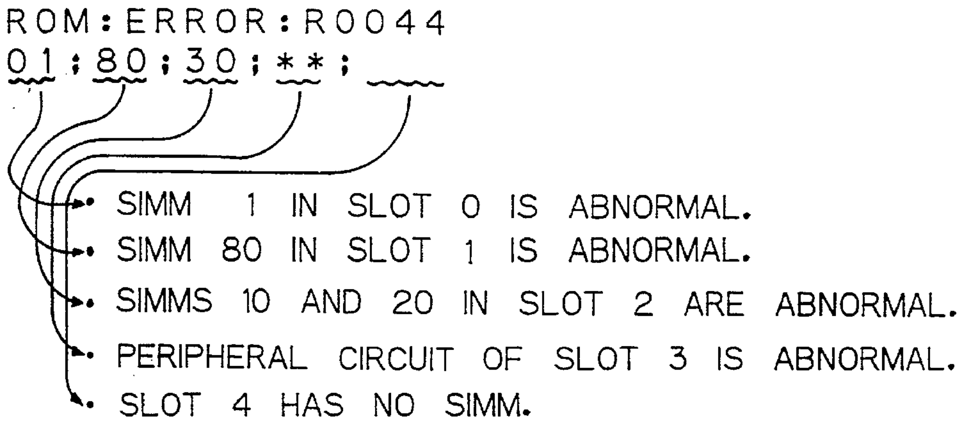
FIG. 7 is a diagram for explaining the contents displayed on the LCD shown in FIG. 6.

In Step S10, it is checked to see whether or not all bits (all SIMMs) have been tested. If it is YES to show that all SIMMs have been tested, Step S11 is carried out. If it is NO, Step S7 is carried out to check the next SIMM. In Step S11, it is determined whether or not there are any memory abnormalities. Namely, it checks to see whether or not Step S9 has added SIMM numbers involving memory abnormalities to the detailed slot information. If it is YES, in Step S12, memory diagnostic information is displayed on a console or an LCD (Liquid Crystal Display). For example, memory diagnostic information of FIGS. 6 and 7 is displayed to show a maintenance person the slot numbers and SIMM numbers on which memory abnormalities have been found.

As explained above, data is written to and read from a memory board 15 having a plurality of slots. The written and read data are compared with each other. If they do not agree with each other, it is determined that there is a memory abnormality. Then, the slot address registers 12 are examined to find a slot number related to the memory abnormality. Then, the slot capacity registers 13 are examined according to the slot number, to find a memory capacity corresponding to the slot number. The SIMM table 14 is looked up according to the memory capacity, to find relationships between SIMM numbers and data bit positions. According to bit positions where the written and read data disagree with each other, a SIMM number involving a memory abnormality is found. Slot numbers and SIMM numbers involving memory abnormalities thus found are displayed. Seeing the display, a maintenance person replaces the abnormal SIMMs in each of the abnormal slots, the SIMMs being minimum replacement units. Unlike the prior art that replaces all SIMMs including normal and abnormal ones in an abnormal slot, the present invention efficiently replaces only defective parts and quickly restores normality.

Figure 3A:
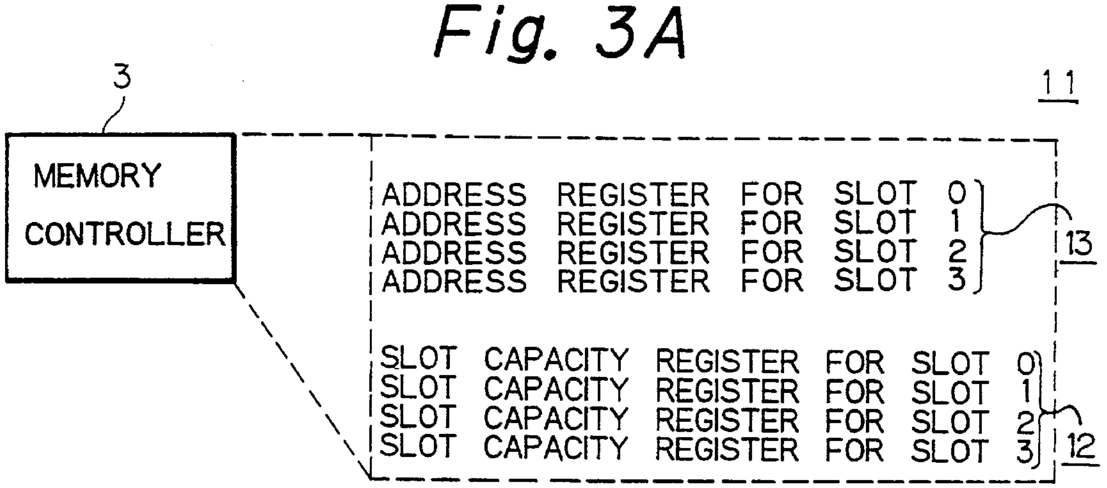
FIGS. 3A, 3B, and 3C are diagrams for explaining an example of a method of detecting defective memory locations according to the present invention.
Figure 3B:
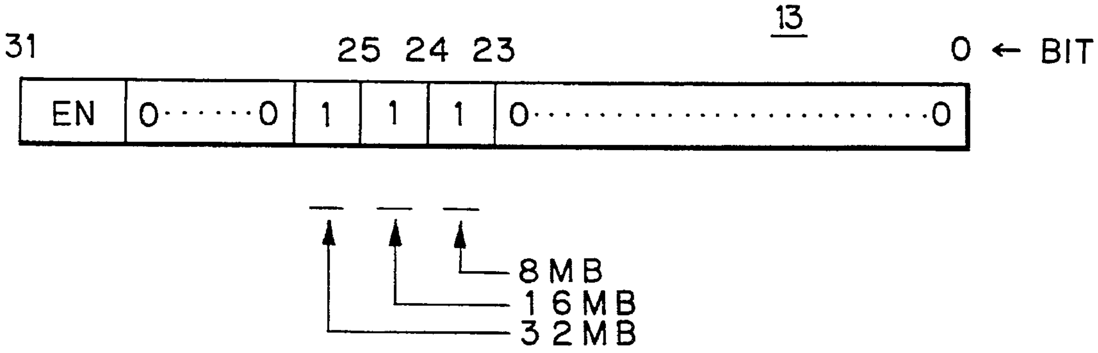
Figure 3C:
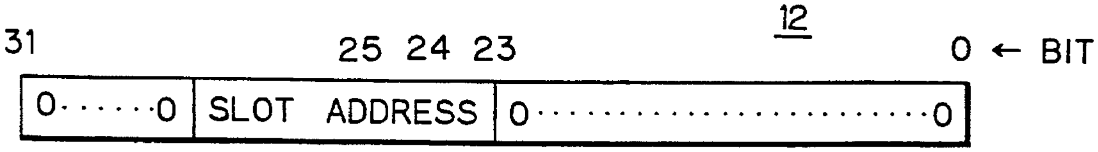

FIGS. 3A, 3B, and 3C are diagrams for explaining an example of a method of detecting defective memory locations according to the present invention, and FIG. 4 shows an example of a SIMM table according to the present invention. Note, FIG. 3A shows an example of a memory control register 11 and a memory controller 3, FIG. 3B shows an example of a slot capacity register 13 for a slot n, and FIG. 3C shows a slot address register 12 for the slot n.

As explained with reference to Steps S1 to S3 of FIG. 2 (FIGS. 2A and 2B), a memory controller (3) writes data of 0xa5a5a5a5a5a5a5a5 to a memory address #n and reads the data from the same address. The written and read 64-bit data are compared with each other. If they do not agree with each other, it is determined that there is a memory abnormality. In this case, the register 11 is used to specify a slot number and SIMM numbers involving the abnormality. As shown in FIG. 3A, the memory control register 11 includes the slot address registers 12 for storing slot numbers and the slot capacity registers 13 for storing memory capacities corresponding to the slot numbers.

As described above, in Step S3 of FIG. 2, the data written in Step S1 is compared with the dada read in Step S2, and it is determined whether or not they agree with each other. If they agree with each other, the memory is normal, and Step S11 is carried out. If they do not agree with each other, the memory is abnormal, and Steps S4 through S10 are carried out.

As shown in FIG. 3C, each of the slot address registers 12 has a slot address (for example, the address of first predetermined bits of a slot n). Note, in Step S4 of FIG. 2, slot address registers 12 are referred to according to the memory address #n, to find a slot number where the memory abnormality is present. As shown in FIG. 3C, bits 23, 24, and 25 of each address register store first three bits of a corresponding slot address. When the three bits agree with a corresponding part of the memory address #n, a slot number n of the slot address register in question is provided.

As explained above, in Step S5 of FIG. 2, the slot capacity registers 13 are used to find a memory capacity corresponding to the slot number (slot n) provided by the slot address registers 12 of FIG. 3C where the memory abnormality is found. Values set in bits 23, 24, and 25 of the slot capacity register 13 corresponding to the slot n are read. As shown in FIG. 3B, each of the slot capacity registers 13 stores a memory capacity for a corresponding slot number n. Concretely, for example, the bits 23, 24, and 25 represent memory capacities as follows:

001=8 MB
010=16 MB
100=32 MB

Note, when a first bit (the 31st bit) EN is "1", the slot in question is valid. In this way, data is written to the memory board 15. The written data is then read, and the read data is compared with the written data. When the written and read data disagree with each other, the slot registers 12 and slot capacity registers 13 are referred to, to find a slot number involving a memory abnormality as well as the memory capacity corresponding to the slot number.

Further, as shown in FIG. 4, the SIMM table 14 shows relationships between data bit positions and SIMM numbers for each memory size. Namely, as shown in FIG. 4, the SIMM table shows relationships between data bit positions and SIMM numbers for each memory capacity. When a memory abnormality is found to be present in a slot number n having a memory capacity of 8 MB, according to the slot capacity registers 13 and slot address registers 12 of FIG. 3 (FIGS. 3B and 3C), the following information will be obtained from the SIMM table 14 shown in FIG. 4:

Data bits 00 to 15=simm 0
Data bits 16 to 31=simm 1
Data bits 32 to 47=simm 2
Data bits 48 to 63=simm 3 (Table 1)

If the comparison of written data with read data shows that there are errors in bits 00 to 15, it will be determined that the simm 0 contains failed memory (memory abnormality). Similarly, any one of the simm 1 to simm 3 can be specified.

Further, when a memory abnormality is found to be present on a slot number n having a memory capacity of 16 MB, according to the slot capacity registers 13 and slot address registers 12 of FIG. 3, the following information will be obtained from the SIMM table 14 shown in FIG. 4:

Data bits 00 to 07=simm 0
Data bits 08 to 15=simm 1
Data bits 16 to 23=simm 2
Data bits 24 to 31=simm 3
Data bits 32 to 39=simm 4
Data bits 40 to 47=simm 5
Data bits 48 to 55=simm 6
Data bits 56 to 63=simm 7

If the comparison of written data with read data tells that there are errors in bits 08 to 15, it will be determined that the simm 1 has a memory abnormality. Similarly, any one of simm 0, and simm 2 to simm 7 can be specified.

In addition, when a memory abnormality is found to be present in a slot number n having a memory capacity of 32 MB, according to the slot capacity registers 13 and slot address registers 12 of FIG. 3, the following information will be obtained from the SIMM table 14 shown in FIG. 4:

Data bits 00 to 07=simm 0
Data bits 08 to 15=simm 1
Data bits 16 to 23=simm 2
Data bits 24 to 31=simm 3
Data bits 32 to 39=simm 4
Data bits 40 to 47=simm 5
Data bits 48 to 55=simm 6
Data bits 56 to 63=simm 7

If the comparison of written data with read data tells that there are errors in bits 16 to 23, it will be determined that the simm 2 has a memory abnormality.

Similarly, any one of the simm 0, simm 1, and simm 3 to simm 7 can be specified.

Next, a concrete example will be explained.

(1) Data of 0xa5a5a5a5a5a5a5a5 is written to a memory address #n of the memory board 15. Note, as described above, the pattern "0xa5a5a5a5a5a5a5a5" corresponds to the 64-bits binary data "1010 0101 1010 0101 . . . 1010 0101".

(2) 64-bit data is read out of the same memory address #n of the memory board.

(3) The data written in the step (1) is compared with the data read in the step (2). If they agree with each other, the next address is tested according to the steps (1) and (2). If they do not agree with each other, the next step (4) is carried out.

(4) Since the written and read data disagree with each other, the slot address registers 12 of FIG. 3C are referred to, to find a corresponding slot number n.

(5) According to the slot number n found in the step (4), the slot capacity registers 13 of FIG. 3B are referred to, to find a memory capacity corresponding to the slot n.

(6) According to the memory capacity found in the step (5), the SIMM table 14 of FIG. 4 is looked up (read) to find the relationships between the data bit positions and SIMM numbers. If the memory capacity is 8 MB, for example, the relationships (Table 1) mentioned above are found.

(7) The written data is compared with the read data, to specify SIMM numbers. For example, the written and read data may be as follows with the memory capacity of 8 MB:

Written data: 0xa5a5a5a5a5a5a5a5

Read data: 0xa5a5a5a5ffffffff (I) Data bits 00 to 15 corresponding to the SIMM 0 are picked up as follows:

0xa5a5 (bits 00 to 15 of written data)

0xffff (bits 00 to 15 of read data)

These data are compared with each other. Since they disagree with each other, the SIMM 0 is determined to be defective.

(II) Data bits 16 to 31 corresponding to the SIMM 1 are picked up as follows:

0xa5a5 (bits 16 to 31 of written data)

0xffff (bits 16 to 31 of read data)

These data are compared with each other. Since they disagree with each other, the SIMM 1 is determined to be defective.

(III) Data bits 32 to 47 corresponding to the SIMM 2 are picked up as follows:

0xa5a5 (bits 32 to 47 of written data)

0xa5a5 (bits 32 to 47 of read data)

These data are compared with each other. Since they agree with each other, the SIMM 2 is determined to be good.

(IV) Data bits 48 to 63 corresponding to the SIMM 3 are picked up as follows:

0xa5a5 (bits 48 to 63 of written data)

0xa5a5 (bits 48 to 63 of read data)

These data are compared with each other. Since they agree with each other, the SIMM 3 is determined to be good.

FIGS. 5A, 5B, and 5C are diagrams for explaining an operation of the method of detecting defective memory locations according to the present invention. Note, FIGS. 5A to 5C show information of actually mounted memories, an allocation of physical addresses, and diagnostic results to be notified and displayed. These pieces of information will be explained.

FIG. 5A shows an example of physical memory slot information, and FIG. 5B shows slot-X main memory information. As shown in FIGS. 5A and 5B, each piece of main memory slot-0 information to main memory slot-15 information includes various data (① an availability flag, ② an allocated physical address, and ③ a capacity) of a corresponding slot-X (where, X is any one of 0 to 15). Note, a main memory total capacity indicates the total memory capacity of the slots 0 to 15.

Slot-SIMM detailed information shown in FIG. 5C involves a string of bits each indicating whether or not a corresponding SIMM of a corresponding slot is normal.

Concretely, as shown in FIG. 5B, the slot-x memory information indicates as as follows:

(1) The availability flag consists of bits that provide the following information:

0X80: Available

0X40: Defective parts are present.

0X00: Unavailable (2) Bits for allocated physical addresses (units f megabits) are as follows:

0X0000: 0X0 0000 0000

0X0008: 0X0 0080 0000

0X0010: 0X0 0100 0000

0X0020: 0X0 0200 0000

. . .

. . .

0X0040: 0X0 0400 0000

0X0080: 0X0 0800 0000

0X0100: 0X0 1000 0000

(3) The memory capacity (units of bytes) of each slot is represented with hexadecimal numbers.

FIG. 5C shows detailed information of SIMMs of each slot.

b"xxxx xxx1": simm 0 is abnormal.

b"xxxx xx1x": simm 1 is abnormal.

b"xxxx x1xx": simm 2 is abnormal.

b"xxxx 1xxx": simm 3 is abnormal.

b"xxx1 xxxx": simm 4 is abnormal.

b"xx1x xxxx": simm 5 is abnormal.

b"x1xx xxxx": simm 6 is abnormal.

b"1xxx xxxx": simm 7 is abnormal.

Namely, a bit representing a simm (SIMM) is set to "1" if the SIMM in question is abnormal.

FIG. 6 shows an example of diagnosed abnormalities displayed on an LCD. When the steps shown in FIGS. 2A, 2B, 3A to 3C, and 4 carry out a memory diagnosis and specify slot numbers and SIMM numbers that involve abnormalities, these data are added to physical memory slot information as shown in FIG. 5 (FIGS. 5A to 5C). The information is then displayed on the LCD (Liquid Crystal Display) as follows:

① ROM:ERROR:R0044

② xx; ③ xx; ④ xx; ⑤ xx; ⑥ xx

The above information (1) indicates that a memory error was detected by memory diagnosis and that even a reduced memory operation was impossible.

The ②, ③, ④, ⑤, and ⑥ indicate memory slot numbers X (from 0 to 4) on a CPU (Central Processing Unit) board and show the statuses of mounted SIMMs. In the above, "xx" is an 8-bit hexadecimal number representing the positions of SIMMs. Each bit is set to 1 when a corresponding SIMM is abnormal and to 0 when the SIMM is normal.

A maintenance person (operator) may see the LCD after the memory diagnosis and easily find the slot numbers and SIMM numbers that have memory abnormalities. The maintenance person then replaces only the abnormal SIMMs, to restore normality.

FIG. 7 shows the contents displayed on the LCD shown in FIG. 6, and more particularly shows an example of a memory diagnostic result according to the present invention displayed on a display unit.

ROM:ERROR:R0044

01;80;30**;

This indicates that reduced memory operation is impossible.

"01;80;30;**" means as follows:

SIMM 0 on slot 0 is abnormal.

SIMM 80 on slot 1 is abnormal.

SIMMs 10 and 20 on slot 2 are abnormal.

Peripheral circuit in slot 3 is abnormal.

Slot 4 has no SIMM.

Figure 8:
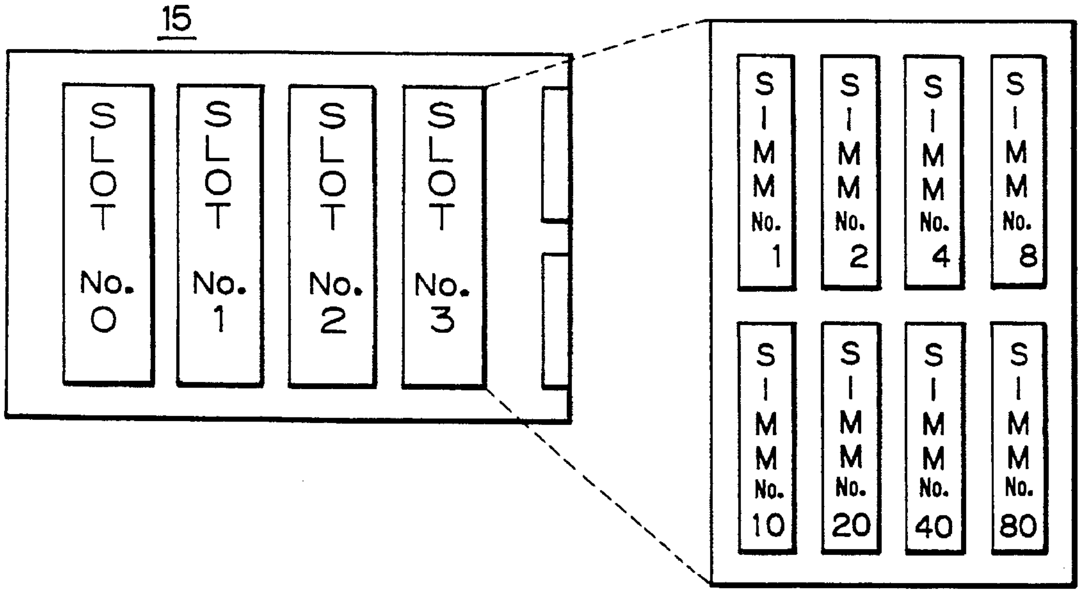
FIG. 8 is a diagram showing an example of a memory board.

FIG. 8 shows an example of a memory board, and more particularly shows examples of slot numbers and SIMM numbers at mounting positions.

In FIG. 8, a memory board 15 has a plurality of slots arranged to form a main storage device. Slots 0 to 3 are arranged on the memory board 15, and thus, in this example, there are four slots. Each of the slots has eight SIMMs numbered 1, 2, 4, 8, 10, 20, 40, and 80, as shown in an enlarged view on the right-hand side of the figure.

The steps shown in FIG. 2 (FIGS. 2A and 2B) are carried out to diagnose the memory board 15 of FIG. 8, to specify slot numbers and SIMM numbers involved in memory abnormalities. The result of the diagnosis is displayed on an LCD. Since the SIMMs are the minimum units for replacement, a maintenance person only has to replace only specified to SIMMs with new ones to restore normality.

Figure 9:
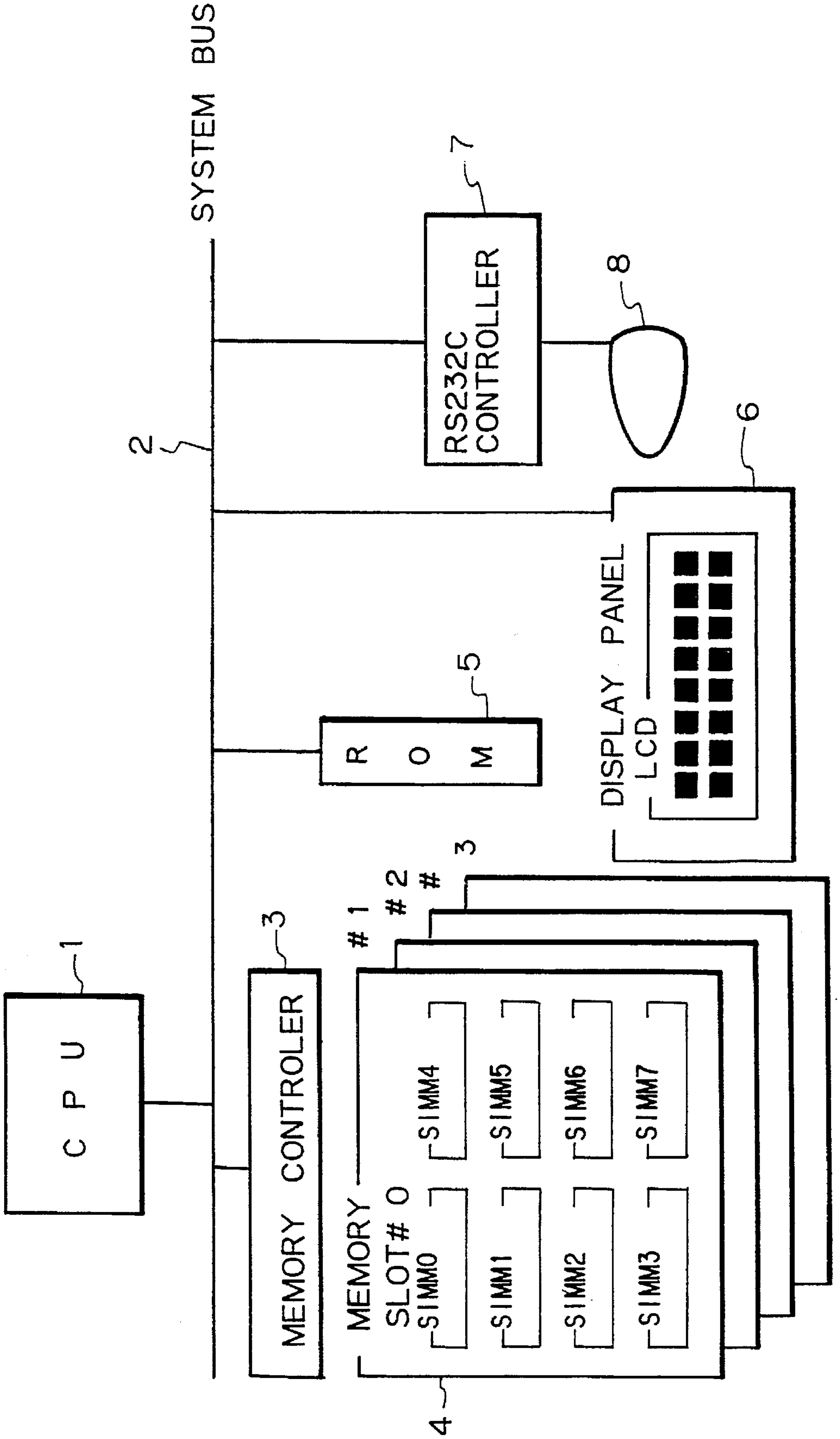
FIG. 9 is a block diagram showing a whole configuration of a computer system applying the present invention.

FIG. 9 shows a whole configuration of a computer system applying the present invention.

As shown in FIG. 9, the computer system applying the above described method of specifying abnormal (determining failed) memory locations comprises a CPU1, a system bus 2, a memory controller 3, a memory (memory board) 4, a ROM 5, an LCD 6, a controller 7, and a display device 8. The memory 4 includes four slots (slots 0 to 3) similar to the memory board 15 shown in FIG. 8, and the controller is, for example, an RS-232C interface board.

Figure 10:
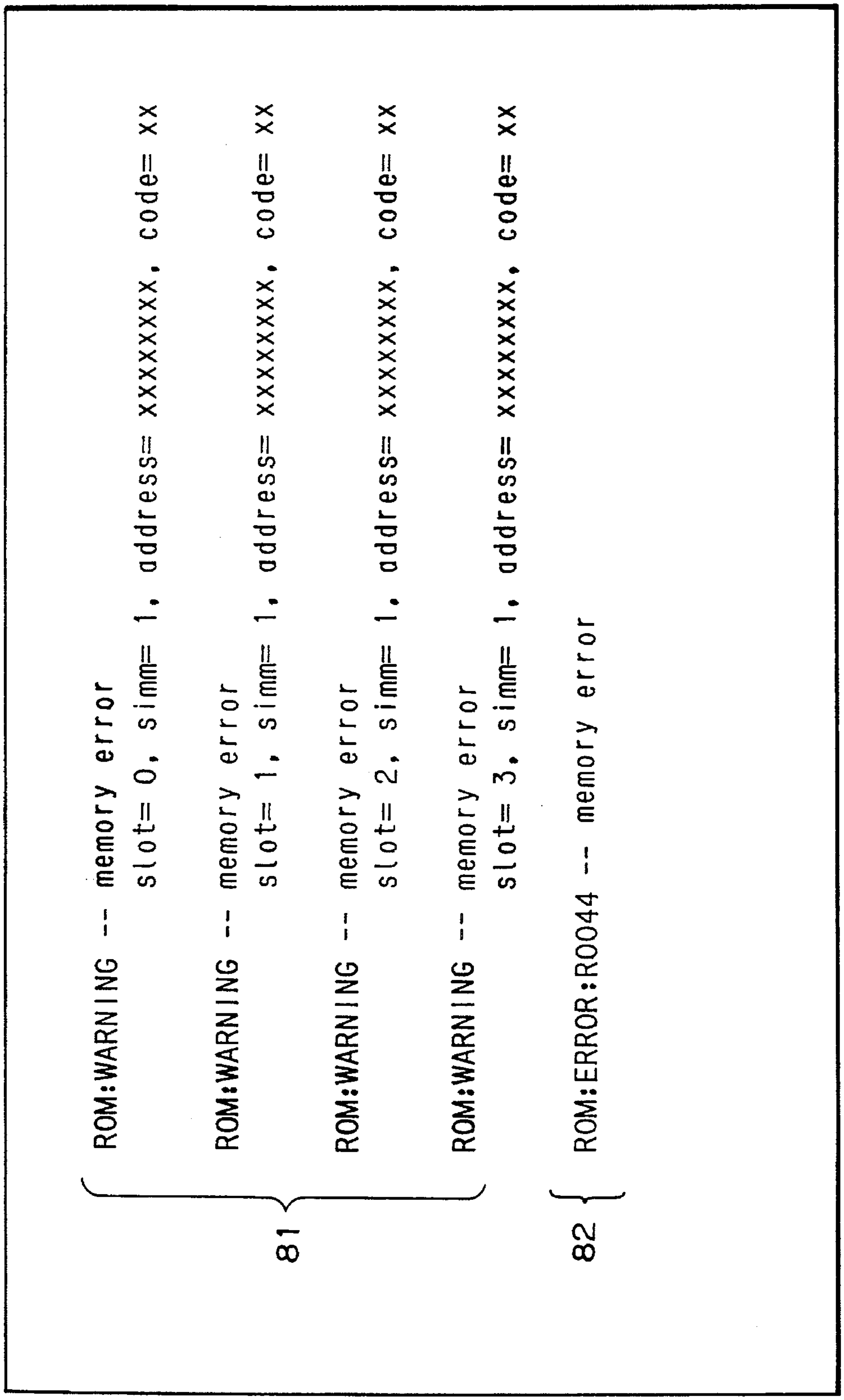
FIG. 10 is a diagram showing an example of diagnosed abnormalities displayed on the display device shown in FIG. 9.

FIG. 10 shows an example of diagnosed abnormalities (memory failures) displayed on the display device shown in FIG. 9.

As shown in FIG. 10, when the computer system applying the method of detecting defective memory locations of the present invention includes the display device 8, the above information (shown n FIGS. 6 and 7) can be directly displayed on the display 8. Namely, the maintenance person (operator) can confirm by only reading the information (81 and 82) displayed on the display 8 instead of decoding and confirming the information displayed on the LCD (with reference to FIGS. 6 and 7). Note, in the computer system having display 8, the memory diagnostic information can not only be displayed on the display 8, but can also be displayed on the LCD 6.

Concretely, as shown in FIG. 10, the information 81 indicates slot numbers, abnormal simm codes, addresses where the memory is abnormal, memory diagnostic codes, and the like, for each slot. Further, the information 82 indicates when all memories are abnormal.

In the above descriptions, the form of the memory diagnostic information is not limited by that shown in FIGS. 6, 7, or 10, but it can be variously modified.

As described above, the present invention diagnoses a memory board having a plurality of standardized SIMMs (minimum memory units for replacement), to specify slot numbers and SIMM numbers involving memory abnormalities. The present invention then displays these numbers. Unlike the prior art that replaces all normal and abnormal SIMMs on a slot where an abnormality has been found, the present invention specifies the SIMM numbers involving abnormalities on each slot number so that only abnormal SIMMs may be replaced. The present invention, therefore, simplifies maintenance work and quickly deals with defective parts.

Many different embodiments of the present invention may be constructed without departing from the spirit and scope of the present invention, and it should be understood that the present invention is not limited 30 to the specific embodiments described in this specification, except as defined in the appended claims.

We claim:

1. A computer system having a central processing unit, a system bus, a memory controller connected to said central processing unit through said system bus, a memory connected to said memory controller, said memory including a plurality of slots, and each of said slots including a plurality of memory modules, said computer system comprising:

means for writing data to a memory address for diagnosing a main memory including a plurality of slots, each of said plurality of slots including a plurality of memory modules;

means for reading the written data from said memory address of said main memory;

means for comparing the read data with the written data for determining whether or not they agree with each other;

means for determining a slot number of one of said plurality of slots corresponding to the memory address, when said comparing means determines that the read data disagree with the written data;

means for determining a memory size corresponding to the determined slot number;

means for determining relationships between data bit positions and memory module numbers of said plurality of memory modules according to the determined memory size, and for determining a memory module number corresponding to a disagreeing data bit position of the read data compared to the written data as an abnormal memory according to the determined relationships; and means for specifying the slot number and the memory module number of the abnormal memory.

2. A computer system as claimed in claim 1, wherein said slot number determining means refers to slot address registers to determine the slot number related to the abnormal memory.

3. A computer system as claimed in claim 1, wherein said memory size determining means refers to slot capacity registers to determine the memory size.

4. A computer system as claimed in claim 1, wherein said relationships determining means refers to a memory module table to determine the relationships between said data bit positions and said memory module numbers.

5. A computer system as claimed in claim 1, wherein said computer system further comprises a display device, and the specified slot number and memory module number of the abnormal memory are displayed on said display device.

6. A computer system as claimed in claim 1, wherein said computer system further comprises a liquid crystal display, and the specified slot number and memory module number of the abnormal memory are displayed on said liquid crystal display.

7. A method of detecting defective memory locations comprising the steps of:

writing data to a memory address for diagnosing a main memory including a plurality of slots, each of said plurality of slots including a plurality of memory modules;

reading the written data from said memory address of said main memory;

comparing the read data with the written data for determining whether or not they agree with each other;

determining a slot number of one of said plurality of slots corresponding to the memory address, when it is determined that the read data disagree with the written data based on the comparing step;

determining a memory size corresponding to the determined slot number;

determining relationships between data bit positions and memory module numbers of said plurality of memory modules according to the determined memory size;

determining a memory module number corresponding to a disagreeing data bit position of the read data compared to the written data as an abnormal memory according to the determined relationships; and specifying the slot number and the memory module number of the abnormal memory.

8. A method of detecting defective memory locations as claimed in claim 7, wherein said slot number determining step refers to slot address registers to determine the slot number related to the abnormal memory.

9. A method of detecting defective memory locations as claimed in claim 7, wherein said memory size determining step refers to slot capacity registers to determine the memory size.

10. A method of detecting defective memory locations as claimed in claim 7, wherein said relationships and memory module number determining steps refer to a memory module table to determine the relationships between said data bit positions and said memory module numbers.

11. A method of detecting defective memory locations as claimed in claim 7, wherein the specified slot number and memory module number of the abnormal memory are displayed on a display device.

12. A method of detecting defective memory locations as claimed in claim 7, wherein the specified slot number and memory module number of the abnormal memory are displayed on a liquid crystal display.

* * * * *

UNITED STATES PATENT AND TRADEMARK OFFICE

CERTIFICATE OF CORRECTION

PATENT NO. : 5,502,814

DATED : March 26, 1996

INVENTOR(S) : Kazuhiro YUUKI et al.

It is certified that error appears in the above-indentified patent and that said Letters Patent is hereby corrected as shown below:

Column 4

Line 20, "1010 0101 1010 0101...010 0101" should be --1010 0101 1010 0101...1010 0101--.

Column 10

Line 32, delete "30".

Signed and Sealed this

Twenty-fifth Day of June, 1996

Attest:

BRUCE LEHMAN

*Attesting Officer* *Commissioner of Patents and Trademarks*